(12) United States Patent
Zhou et al.

(10) Patent No.: US 6,251,786 B1
(45) Date of Patent: Jun. 26, 2001

(54) METHOD TO CREATE A COPPER DUAL DAMASCENE STRUCTURE WITH LESS DISHING AND EROSION

(75) Inventors: Mei Sheng Zhou; Paul Kwok Keung Ho; Subhash Gupta, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/390,783

(22) Filed: Sep. 7, 1999

(51) Int. Cl.$^7$ .................................................. H01L 21/00
(52) U.S. Cl. ..................... 438/692; 216/38; 216/88; 216/91; 216/79; 438/723; 438/724; 438/745
(58) Field of Search .................. 156/345 LP; 216/38, 216/67, 79, 88, 89, 91; 438/691, 692, 693, 697, 745, 626, 627, 631, 633, 645, 723, 724, 743, 744

(56) References Cited

U.S. PATENT DOCUMENTS

| | | | |
|---|---|---|---|
| 5,674,787 | 10/1997 | Zhao et al. | 437/230 |
| 5,723,387 | 3/1998 | Chen | 438/692 |
| 5,741,626 | 4/1998 | Jain et al. | 430/314 |
| 5,744,376 | 4/1998 | Chan et al. | 437/190 |
| 5,814,557 | 9/1998 | Venkatraman et al. | 438/622 |
| 5,818,110 | 10/1998 | Cronin | 257/775 |
| 6,017,803 | * 1/2000 | Wong | 438/692 X |
| 6,083,835 | * 7/2000 | Shue et al. | 438/692 X |
| 6,103,625 | * 8/2000 | Marcyk et al. | 438/692 X |
| 6,114,246 | * 9/2000 | Weling | 438/692 X |

* cited by examiner

*Primary Examiner*—William Powell
(74) *Attorney, Agent, or Firm*—George O. Saile; Rosemary L.S. Pike

(57) ABSTRACT

A dual damascene structure is created in a dielectric layer, the structure contains a barrier layer while a cap layer may or may not be provided over the layer of dielectric for further protection of the dual damascene structure. The surface of the copper in the dual damascene structure is recessed, a thin film is deposited and planarized/partially removed by either CMP or a plasma etch thereby providing a sturdy surface above the copper of the dual damascene structure that prevents dishing and erosion of this surface.

20 Claims, 3 Drawing Sheets

METHOD TO CREATE A COPPER DUAL DAMASCENE STRUCTURE WITH LESS DISHING AND EROSION

BACKGROUND OF THE INVENTION (1) Field of the Invention

The invention relates to the fabrication of integrated circuit devices, and more particularly, to a method of reducing dishing and erosion of the copper surface during and after copper Chemical Mechanical Planarization (CMP).

(2) Description of the Prior Art

With continued micro-miniaturization of semiconductor devices and device features, the conductivity of the metal interfaces that are used to interconnect these devices takes on increased importance. It is for this reason that increased emphasis is being placed on finding low resistivity materials and on mastering the art of using these materials in the manufacturing of semiconductor devices. The most widely used material for metal interconnects since the start of the semiconductor industry has been aluminum. Aluminum does however, for very small devices, impose limitations in line-width whereby electromigration is one of the major drawbacks to the use of aluminum in the manufacturing of micron and sub-micron devices. Substitute metals, such as copper, gold and silver are therefore actively investigated since, in addition to low resistivity, these metals offer better resistance to electromigration.

Where the replacement metals that are being investigated as yet present serious problems is in their formation of undesirable inter-metallic alloys and/or in the formation of recombination centers in other parts of the semiconductor device while some of these metal are also prone to have high rates of diffusivity making their application more difficult. Copper is the metal that in recent years has experienced an intense level of investigation relating to both its basic application and in methods of eliminating undesirable side effects where copper is being used. Copper offers the advantages of low cost and ease of processing but suffers from the serious side effect that copper oxidation takes place at relatively low temperatures.

During standard processes of interconnect line formation, photoresist is used to define and during the etching of the required interconnect line pattern. After the etch of this line pattern has been completed, the photoresist must be removed which is performed in a highly oxidized environment thereby exposing the copper to the process of oxidation. The photoresist can, for instance, be removed using an oxygen plasma that reduces the photoresist to an ash that can readily be removed.

Two widely used approaches in creating metal interconnects is the use of the damascene and the dual damascene structures. The application of the Damascene process continues to gain wider acceptance, most notably in the process of copper metalization due to the difficulty of copper dry etch where the Damascene plug penetrates deep in very small, sub-half micron, Ultra Large Scale integrated devices. Recent applications have successfully used copper as a conducting metal line, most notably in the construct of CMOS 6-layer copper metal devices.

In the formation of a damascene structure, a metal plug is first formed in a surface; this surface in most instances is the surface of a semiconductor substrate. A layer of Intra Level Dielectric (ILD) is deposited (using for instance Plasma Enhanced CVD technology with $SiO_2$ as a dielectric) over the surface into which trenches for metal lines ate formed (using for instance Reactive Ion Etching technology).

The trenches overlay the metal plug and are filled with metal (use for instance either the CVD or a metal flow process). Planarization of this metal to the top surface of the layer of ILD completes the damascene structure. Some early damascene structures have been achieved using Reactive Ion Etching (RIE) for the process of planarization but Chemical Mechanical Planarization (CMP) is used exclusively today.

An extension of the damascene process is the dual damascene process whereby an insulating or dielectric material, such as silicon oxide, is patterned with several thousand openings for the conductive lines and vias, which are filled at the same time with metal. Damascene is an interconnection fabrication process in which grooves are formed in an insulating layer and filled with metal to form the conductive lines. Dual damascene is a multi-level interconnection process in which, in addition to forming the grooves of single damascene, conductive via openings also are formed. One of the dual damascene approaches uses a dielectric layer that is formed by three consecutive depositions whereby the central layer functions as an etch stop layer. This etch stop layer can be SiN, the top and bottom layer of this three layer configuration can be $SiO_2$. This triple layer dielectric allows first forming the vias by resist patterning the vias and etching through the three layers of dielectric. The conductive pattern can then be formed in the top layer of dielectric whereby the central layer of SiN forms the stop layer for the etch of the conducting pattern. Another approach, still using the three-layer dielectric formed on the substrate surface, is to first form the pattern for the conducting lines in the top layer of the dielectric whereby the SiN layer again serves as etch stop. The vias can then be formed by aligning the via pattern with the pattern of the conducting lines and patterning and etching the vias through the etch stop layer of SiN and the first layer of dielectric. Yet another approach is to deposit the three layer dielectric in two steps, first depositing the first layer of $SiO_2$ and the etch stop layer of SiN. At this point the via pattern can be exposed and etched. The top layer of $SiO_2$ dielectric is then deposited; the conducting lines are now patterned and etched. The SiN layer will stop the etching except where the via openings have already been etched.

Dual damascene is an improvement over single damascene because it permits the filling of both the conductive grooves and vias with metal at the same time, thereby eliminating process steps.

Due to the fact that copper is very difficult to process by RIE, the CMP method may need to be used where copper is used as a wiring material. To polish copper at a high rate without scratching the buried wiring formation, the copper etch rate must be raised by increasing the amount of the component responsible for copper etching contained in the polishing slurry. If the component is used in an increased amount, the etching will occur isotropically. Consequently, buried copper is etched away, causing dishing in the wiring.

It has already been indicated that copper is often preferred due to its low resistivity, high electromigration resistance and stress voiding resistance. Copper however exhibits the disadvantage of high diffusivity in common insulating materials such as silicon oxide and oxygen-containing polymers. This leads to, for instance, the diffusion of copper into polyimide during high temperature processing of the polyimide resulting in severe corrosion of the copper and the polyimide due to the copper combining with oxygen in the polyimide. The corrosion may result in loss of adhesion, delamination, voids, and ultimately a catastrophic failure of the component. A copper diffusion barrier is therefore often required. A barrier layer can typically contain a variety of elements such as combinations of one or more of the elements of titanium with titanium nitride with tungsten or tungsten nitride, tungsten, tantalum, niobium, molybdenum. The invention uses a barrier layer that is Tantalum (Ta) based, other types of barrier layers such as barrier layers that contain tungsten or titanium or their compounds can also be applied within the scope of the invention.

For the dual damascene structure that uses copper for the metal interconnects, in combination with Ta and/or a Ta compound as barrier layer, the dishing of large trenches and the erosion of small device features becomes excessive after the process of CMP of the copper surfaces due to the high selectivity of copper to Ta-based material. This high selectivity is caused by the hard and chemically inert nature (and therefore low polishing rate) of the Ta-based material as compared with the soft surface (and therefore high polishing rate) of the layer of copper. This difference between the copper (of the interconnect metal) and the Ta (of the barrier layer) results in copper being removed at a faster rate than the Ta or Ta-based material thereby causing serious effects of dishing and erosion on the surface of the copper interconnect metal. Thus, it is difficult to form highly reliable LSI wiring made of copper.

As device dimensions decrease, aluminum metalization used for the via plugs and/or for the metal conducting lines, encounters the problem of high resistivity and lower electromigration resistance. Copper thin films offer low resistivity and show good electromigration resistance. They would therefore appear to be attractive as Very Large Scale Integrated conductor materials, especially as device dimensions approach deep-submicron sizes. A dry-etching process for Cu films has however not been successfully developed which is one chief reason that Cu has not been widely considered for such applications. Also, wet-etch and sputter etch cannot pattern copper due to the non-volatile copper halides compounds.

The invention teaches a method that can reduce effects of dishing and erosion of copper surfaces used in interconnect metal thereby improving surface planarity and surface uniformity of copper surfaces used in semiconductor devices.

U.S. Pat. No. 5,741,626 (Jain) shows a Cu dual damascene process.

U.S. Pat. No. 5,818,110 (Cronin) discloses an etch barrier layer formed over the Cu plug after the CMP. See col. 5, lines 35.

U.S. Pat. No. 5,814,557 (Venkatraman et al.) discloses a metal layer 16 over a Cu plug in a dual damascene process.

U.S. Pat. No. 5,674,787 (Zhao et al.) shows a cap/barrier layer 24 over a Cu interconnect.

U.S. Pat. No. 5,723,387 (Chen) recites a cap layer over a Cu plug after CMP.

U.S. Pat. No. 5,744,376 (Chan et al.) shows a SiN cap layer over a Cu plug after CMP.

SUMMARY OF THE INVENTION

A principle objective of the invention is to reduce dishing and erosion of dual damascene copper surfaces.

Another objective of the invention is to improve planarity and uniformity of dual damascene copper surfaces.

In accordance with the objectives of the invention a new method is provided to form copper dual damascene interconnect structures. A layer of Inter Metal Dielectric (IMD) is deposited over the substrate.

Under the first embodiment of the invention a cap layer is deposited over the IMD, the dual damascene structures is formed through the cap layer and embedded in the IMD. A barrier layer is blanket deposited over the dual damascene structure including the surface of the surrounding cap layer; the copper for the dual damascene structure is deposited and polished. This polish proceeds to the surface of the barrier layer after which the surface of the copper profile of the dual damascene structure is lowered (stripped) by wet-etch technology. The surface of the copper is now below the surface of the barrier layer, a thin film is blanket deposited over the copper and the barrier layer. The thin film is removed by CMP creating a surface of the copper profile of the dual damascene structure where the surface above the copper (containing remainders of the deposited thin film) is hard enough that effects of dishing and erosion of the copper surface are eliminated.

The second embodiment of the invention does not deposit the above indicated cap layer but otherwise follows the same steps as the first embodiment of the invention with the same results, as follows: deposit a layer of IMD over the substrate, form the dual damascene structure in the IMD, deposit a barrier layer over the dual damascene, deposit and polish the copper for the dual damascene structure down to the surface of the barrier layer. Lower (strip) the surface of the dual damascene structure to where it is below the surface of the barrier layer, deposit thin film over the copper and the barrier layer. Remove the thin film creating a surface of the copper profile of the dual damascene structure where the surface above the copper (containing remainders of the deposited thin film) is hard enough that effects of dishing and erosion of the copper surface are eliminated.

The third embodiment of the invention follows essentially the same procedures as the first embodiment of the invention up through and including the deposition of a thin layer of film. This film is, under the third embodiment of the invention, removed with a plasma etch providing the same results as gained under the preceding two embodiments of the invention.

The fourth embodiment of the invention follows essentially the same procedures as the second embodiment of the invention up through and including the deposition of a thin layer of film. This film is, under the fourth embodiment of the invention, removed with a plasma etch providing the same results as gained under the preceding three embodiments of the invention.

DESCRIPTION OF THE PREFERRED EMBODIMENTS

Figure 1:
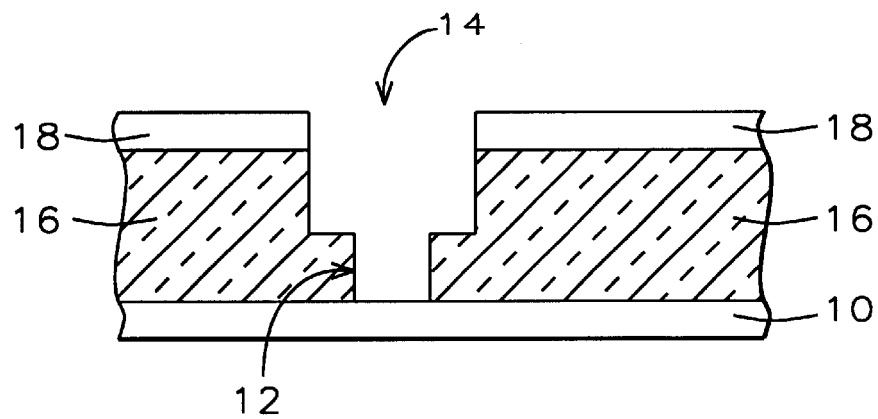
FIG. 1 shows a cross section of the dual damascene profile including a cap layer.

Referring now specifically to FIG. 1, there is shown the cross section of a dual damascene structure that has been created on top of a metal surface 10. The dual damascene structure consists of the via part 12, that is in direct contact with the underlying layer of metal 10, and the interconnect line part 14 that overlays the via structure 12. The dual damascene structure has been formed in a layer 16 of Inter Metal Dielectric (IMD). Before the profile of the dual damascene structure has been formed in the IMD, a cap layer 18 has been deposited over the surface of the IMD. The requirements for the cap layer are essentially the same as the requirements for a typical copper barrier layer with the understanding that it can be readily removed from the surface of the IMD by either an etch or CMP. Of the previously indicated materials that can be used for a barrier layer, silicon nitride ($Si_3N_4$) meets the requirements for the application under discussion. A further requirement is that the cap layer be deposited to an adequate thickness, for instance between about 100 and 3000 Angstrom, which allows for a slight over-polish into the cap layer at a later time in the process leaving part of the cap layer in place. This remainder of the cap layer can serve as a copper oxidation/diffusion protection layer thereby eliminating the need to deposit such a layer as a separate processing step. After cap layer 18 has been deposited, the dual damascene profile is created through the cap layer 18 and into the layer of dielectric 16.

Figure 2:
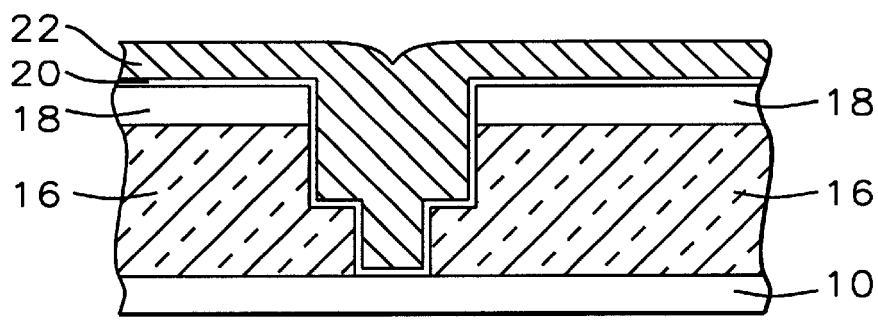
FIG. 2 shows a cross section of the dual damascene structure after deposition of a barrier layer and a blanket deposition of a layer of copper.

FIG. 2 shows how the sidewalls of the dual damascene and the surface of the cap layer above the IMD opening are lined with a Ta-based barrier layer 20, over this barrier layer 20 is blanket deposited a layer of copper 22 that fills the profile of the dual damascene structure and overlays the surface of the barrier layer 20. Other barrier layers such as tungsten or tungsten compounds and titanium or titanium compounds can also be used. The invention is, as previously indicated, not limited to using a Tantalum (Ta) based barrier layer but can also apply barrier layers that contain tungsten or titanium or their compounds.

Figure 3:
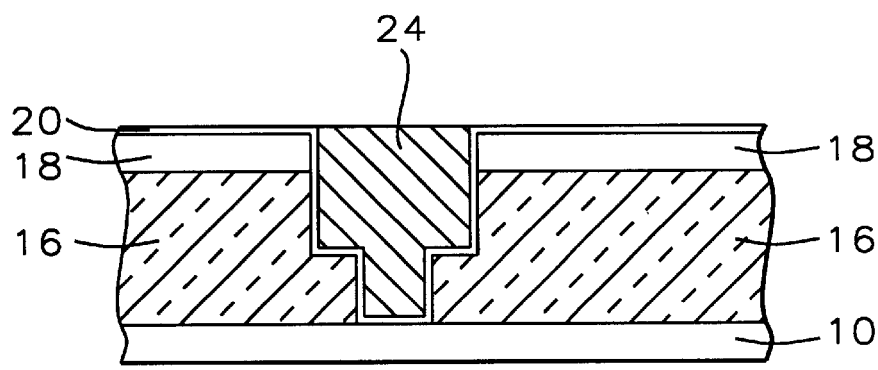
FIG. 3 shows a cross section of the dual damascene structure after the removal of excess copper.

FIG. 3 shows a cross section after completion of the removal of the excess copper from above the surface of the IMD 16, this removal of the copper can be done using a CMP process. During this process the barrier layer 20 that is underlying the copper above the IMD surface can serve as a stop layer. The copper 24 now has the profile of the typical dual damascene structure.

Figure 4:
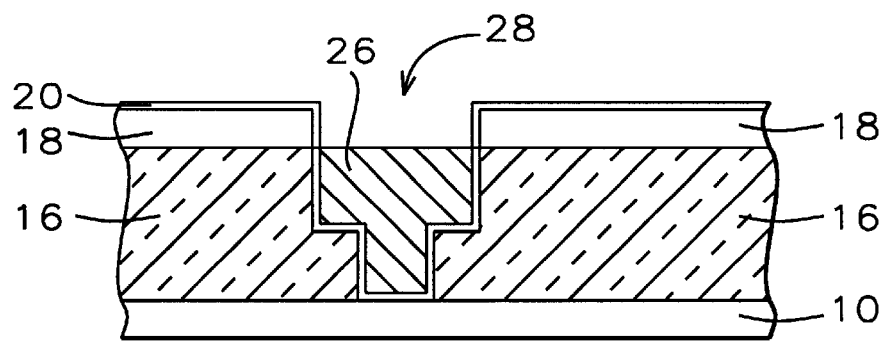
FIG. 4 shows a cross section of the dual damascene structure after the copper in the dual damascene profile has been recessed.

FIG. 4 shows the cross section after the copper (as shown in profile 24, FIG. 3) has been lowered or partially stripped from the dual damascene opening thereby creating a new copper profile 26 in this opening. This stripping of the copper can be done using wet chemistry, for instance using $CH_3COOH/NH_4F$ or $CCl_4/DMSO$ as etchants. FIG. 4 shows that a recess 28 is now created in the profile of the dual damascene structure.

The depth of the indicated recess 28 must be equal to or less than the height of the cap layer 18, this latter height is between about 100 and 3000 Angstrom. This to provide adequate margin for over-polish of the cap layer 18.

It must be noted that for the second and fourth embodiment of the invention, no cap layer 18 is deposited. For these embodiments the cross section of the created recessed layer of copper and the surrounding areas will look as the profile shown in FIG. 4 with the exception that no cap layer 18 will be shown. In addition, the surface of the copper damascene structure will be lowered to below the surface of the IMD, this will be apparent from the art work (FIGS. 7 and 8) that is used to detail the second and fourth embodiment of the invention.

Figure 5:
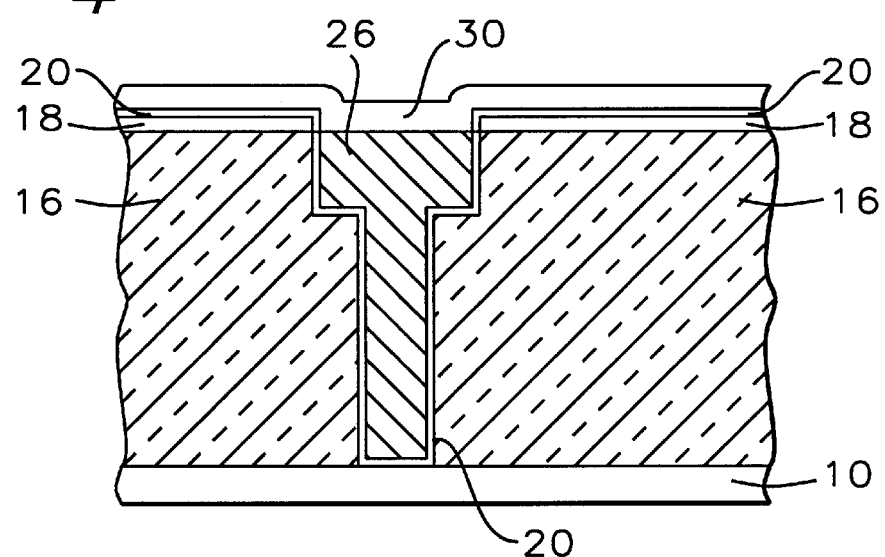
FIG. 5 shows a cross section of the dual damascene structure of the first and third embodiment of the invention after deposition of a thin layer of film.

FIG. 5 shows a cross section after a thin film 30 has been blanket deposited over the Ta-based barrier layer and the recess of the dual damascene profile. This thin film 30 can contain $Si_3N_4$ or any other suitable dielectric such as borosilicate glass ("BSG"), a phosphosilicate glass ("PSG"), borophosphosilicate glass (BPSG) and plasma enhanced silicon nitride (P-SiNx). The purpose of the film 30 is to prevent copper oxidation and to protect the copper surface against chemical or mechanical damage. The thin film 30 over the trenches provides adequate resistance against erosion of the copper during the removal of the Ta-based barrier layer 20 using CMP.

Figure 6:
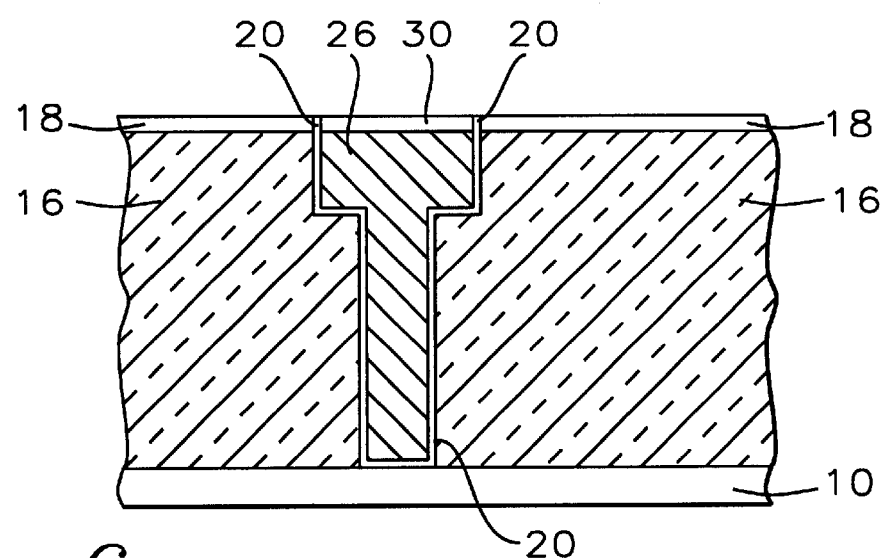
FIG. 6 shows a cross section of the dual damascene structure of the first and third embodiment of the invention after partial removal of the thin layer of film.

FIG. 6 shows a cross section wherein the thin film 30 and the barrier layer 20 on the surface of the layer 16 of IMD has been partially removed by CMP. It must be emphasized that a thin layer of film 30 remains in place above the dual damascene profile 26 and forms a surface that is hard enough to withstand effects of surface dishing or surface erosion. Layers 18 and 30 form a composite layer against diffusion and oxidation of the copper surface of the dual damascene structure.

It must be noted that, if the CMP of the surface of film 30 (FIG. 5) is extended and proceeds into the cap layer 18 without however removing the cap layer above the surface of the IMD, no oxidation or diffusion layer needs to be deposited since the (remaining) barrier layer serves that function.

Figure 7:
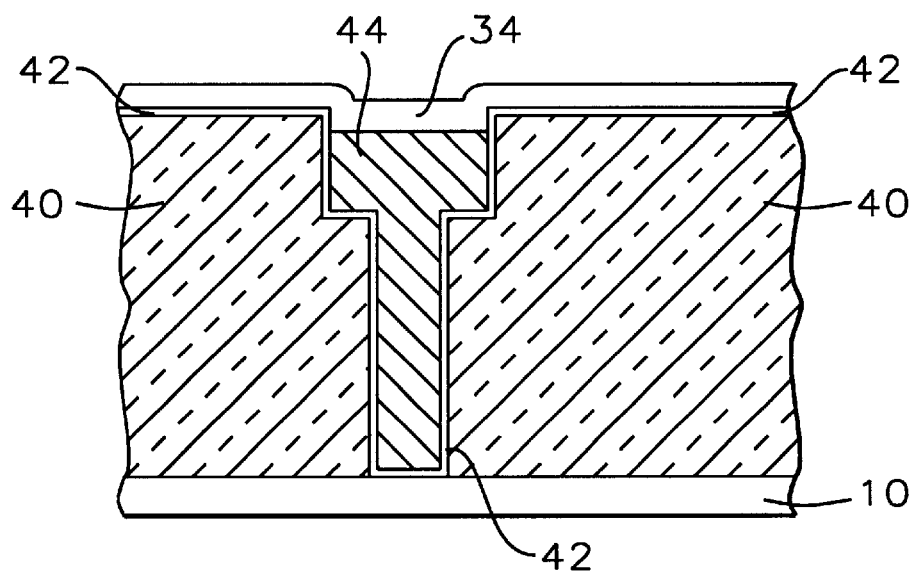
FIG. 7 shows a cross section of the dual damascene structure of the second and fourth embodiment of the invention after the deposition of a thin layer of film.

FIG. 7 addresses the second embodiment of the invention. FIG. 7 is arrived at by following essentially the same steps as previously highlighted under FIGS. 1 through 5 with the notable difference that no cap layer has been deposited in the creation of the profile whose cross section is shown in FIG. 7. A comparison between FIG. 5 of the first embodiment and FIG. 7 of the second embodiment will make this readily apparent.

The steps taken to create the dual damascene structure of FIG. 7 are as follows:

depositing a layer 40 of IMD over a metal surface 10 creating the dual damascene profile in the deposited layer 40 of IMD depositing a barrier layer 42 within the dual damascene structure and over the surface of the layer 40 of IMD blanket depositing a layer 44 of copper over the barrier layer 42 removing the excess copper down to the top surface of the barrier layer 42 creating a recess in the copper contained in the dual damascene profile thereby creating copper fill 44 in the dual damascene profile.

FIG. 7 shows the deposition of a layer 34 of thin film over the surface of the barrier layer 42 and the surface of the recessed copper 44 in the dual damascene opening. All comments previously made with regard to thin film layer 30 (FIG. 5) are equally valid for the thin film layer 34 of FIG. 7. The thin film 34 over the trenches provides adequate resistance against erosion of the copper during the removal of the Ta-based barrier layer 42 using CMP.

Figure 8:
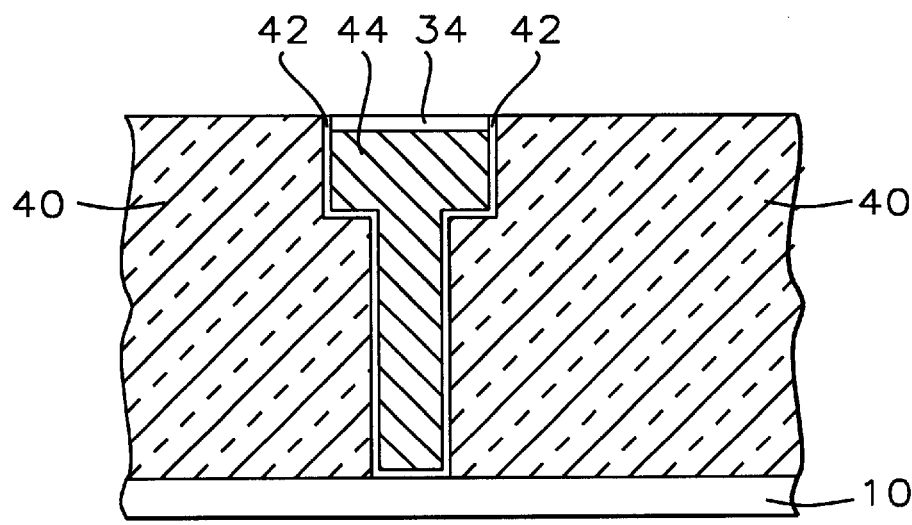
FIG. 8 shows a cross section of the dual damascene structure of the second and fourth embodiment of the invention after partial removal of the thin layer of film.

FIG. 8 shows the cross section of the dual damascene structure after thin film 34 (FIG. 7) and barrier metal 42 on the surface of layer 40 of IMD has been polished by CMP. The layer of film 34 that is above the dual damascene profile forms a surface that is hard enough to withstand effects of surface dishing or surface erosion. Since the second embodiment does not provide the copper oxidation and diffusion protection (that is offered under the first embodiment by the remainder of the not completely removed cap layer), such a layer is deposited over the structure after the polishing of the thin film 34 has been completed. This latter layer is not shown in FIG. 7. Layer 34 and the subsequently deposited layer form a composite layer against diffusion and oxidation of the copper surface of the dual damascene structure.

The processing sequence of the third embodiment differs from the first embodiment (FIG. 5) in the way in which the thin film 30, after its deposition, is removed by using a plasma etch process thereby requiring one less step of CMP (when compared with the first embodiment) while furthermore good global planarity can be achieved is a result of the first CMP. For the etch, both Cl and F plasma etch can be used. The Cl plasma etch provides high selectivity of etching Ta-based material (contained in the cap layer) as compared with $Si_3N_4$ (contained in the thin film layer). After the removal of the Ta-based material, an overetch can be done on either the cap layer or on the IMD. The extent of this overetch depends on the thickness of the thin film 30 above the copper within the dual damascene structure.

The processing sequence of the fourth embodiment differs from the second embodiment (FIG. 7) in the way in which the thin film 34, after its deposition, is removed by using a plasma etch process thereby requiring one less step of CMP (when compared with the second embodiment) while furthermore good global planarity can be achieved is a result of the first CMP. For the etch, both Cl and F plasma etch can be used. The Cl plasma etch provides high selectivity of etching Ta-based material (contained in the cap layer) as compared with Si3N4 (contained in the thin film layer). After the removal of the Ta-based material, an overetch can be done on either the cap layer or on the IMD. The extent of this overetch depends on the thickness of the thin film 34 above the copper within the dual damascene structure.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of treating the surface of a copper dual damascene structure on the surface of a semiconductor substrate, comprising the steps of:

providing a semiconductor substrate;

forming a dual damascene structure on the surface of said substrate, said dual damascene structure comprising a lower of via pattern created in a first layer of dielectric and an upper of interconnect line pattern created in a second layer of dielectric;

recessing the surface of said dual damascene structure;

depositing a thin film over the surface of said recessed dual damascene structure thereby including the surface surrounding said dual damascene structure;

removing part of said deposited thin film; and depositing a diffusion barrier layer over the surface of said thin film.

2. The method of claim 1 wherein forming a dual damascene structure said structure to contain a via or bottom part and an conducting line or upper part is:

depositing a first stop layer of SiN over the surface of said substrate said first stop layer to serve as etch stop for the via opening;

depositing a first layer of dielectric on top of said first stop layer said first layer of dielectric to form the inter-level dielectric layer said first layer to contain $SiO_2$ said first layer of dielectric to serve as the via dielectric;

depositing a second stop layer of PE-CVD SiN on top of said first layer of dielectric said layer of SiN to serve as an second etch stop layer for said conducting line part of said dual damascene structure;

depositing a second layer of dielectric on top of said second stop layer of SiN said second layer of dielectric to serve as interconnect line dielectric;

forming a via pattern in said first layer of dielectric by patterning and etching through said second layer of dielectric furthermore etching through said second stop layer of SiN furthermore etching through said first layer of dielectric furthermore etching through said first stop layer thereby forming the via pattern;

removing said first stop layer from the bottom of said via pattern;

forming a conducting line pattern by patterning and etching said second layer of dielectric thereby using said second stop layer of SiN as etch stop layer thereby forming a conducting line pattern;

depositing a barrier layer over the inside of said dual damascene structure thereby including the surface surrounding said dual damascene structure;

blanket depositing a layer of metal over the surface of said second layer of dielectric thereby including deposition of the metal inside said dual damascene structure; and removing excess metal from the surface of said second layer of dielectric down to the surface of said barrier layer.

3. The method of claim 2 wherein said metal contains copper.

4. The method of claim 2 wherein said barrier layer is selected from the group comprising Ta and W and Ti and their compounds based materials.

5. The method of claim 2 wherein said removing excess metal from the surface of said second layer of dielectric may be further extended to continue said removal below the surface of said barrier layer and to thereby partially remove said barrier layer in a planar manner from the surface of said second layer of dielectric.

6. The method of claim 1 wherein said recessing the surface of said dual damascene structure is etching the copper surface of the conducting line part of said dual damascene structure said etch being a wet-chemistry etch using as etchant $CH_3COOH/NF_3$ or $CCl_4/DMSO$ or any other suitable wet-etch techniques and process parameters thereby lowering the surface of said copper profile contained within said dual damascene structure by a measurable amount.

7. The method of claim 1 wherein said depositing a thin film over the surface of said recessed dual damascene structure thereby including the surface surrounding said dual damascene structure is depositing a film that contains $Si_3N_4$ or any other suitable material that can provide protection of a copper surface against oxidation or chemical or mechanical damage.

8. The method of claim 1 wherein said removing part of said deposited thin film is a Chemical Mechanical Polishing process thereby leaving said thin film in place above the copper surface thereby providing a layer of protection against dishing and erosion for said copper surface of said dual damascene structure whereby said thin film and said barrier layer are completely removed from the surface of said second layer of dielectric by the process of Chemical Mechanical Polishing.

9. The method of claim 1 wherein said removing part of said deposited thin film is a plasma etch process whereby Cl or F plasma can be used as an etchant thereby providing high selectivity of etching Ta or W or Ti or their compounds based material relative to $Si_3N_4$ or similar type material.

10. The method of claim 1 wherein said depositing a diffusion barrier layer over the surface of said thin film is depositing a layer of $Si_3N_4$ or any other suitable material that can provide protection of a copper surface against oxidation or chemical or mechanical damage.

11. A method of treating the surface of a copper dual damascene structure on the surface of a semiconductor substrate, comprising the steps of:

providing a semiconductor substrate;

forming a dual damascene structure on the surface of said substrate, said dual damascene structure comprising a lower of via pattern created in a first layer of dielectric and an upper of interconnect line pattern created in a second layer of dielectric;

recessing the surface of said dual damascene structure;

depositing a thin film comprising a barrier layer over the surface of said recessed dual damascene structure thereby including the surface surrounding said dual damascene structure; and removing part of said deposited thin film.

12. The method of claim 11 wherein forming a dual damascene structure said structure to contain a via or bottom part and an conducting line or upper part is:

depositing a first stop layer of SiN over the surface of said substrate said first stop layer to serve as etch stop for the via opening;

depositing a first layer of dielectric on top of said first stop layer said first layer of dielectric to form the inter-level dielectric layer said first layer to contain $SiO_2$ said first layer of dielectric to serve as the via dielectric;

depositing a second stop layer of PE-CVD SiN on top of said first layer of dielectric said layer of SiN to serve as an second etch stop layer for said conducting line part of said dual damascene structure;

depositing a second layer of dielectric on top of said second stop layer of SiN said second layer of dielectric to serve as interconnect line dielectric;

depositing a cap layer over the surface of said second dielectric;

forming a via pattern in said first layer of dielectric by patterning and etching through said cap layer furthermore etching through said second layer of dielectric furthermore etching through said second stop layer of SiN furthermore etching through said first layer of dielectric thereby forming the via pattern;

removing said first stop layer from the bottom of said via pattern;

forming a conducting line pattern by patterning and etching through said cap layer furthermore etching said second layer of dielectric thereby using said second stop layer of SiN as etch stop layer thereby forming a conducting line pattern;

depositing a barrier layer over the inside of said dual damascene structure thereby including the surface surrounding said dual damascene structure;

blanket depositing a layer of metal over the surface of said second layer of dielectric thereby including deposition of the metal inside said dual damascene structure; and removing excess metal from the surface of said second layer of dielectric down to the surface of said barrier layer.

13. The method of claim 12 wherein said metal contains copper.

14. The method of claim 12 wherein said barrier layer is selected from the group comprising Ta and W and Ti and their compounds based material.

15. The method of claim 12 wherein said cap layer contains $Si_3N_4$ or any other suitable dielectric with the property that it can readily be removed using etch or CMP technology said cap layer to be deposited to a thickness of between 100 and 3000 Angstrom.

16. The method of claim 12 wherein said removing excess metal from the surface of said second layer of dielectric may be further extended to continue said removal below the surface of said barrier layer and to thereby partially remove said barrier layer in a planar manner from above the surface surrounding said dual damascene structure.

17. The method of claim 11 wherein said recessing the surface of said dual damascene structure is etching the copper surface of said dual damascene structure said etching being a wet-chemistry etch using as etchant $CH_3COOH/NF_3$ or $CCl_4$/DMSO or any other suitable wet-etch techniques and process parameters thereby lowering the surface of said copper profile contained within said dual damascene structure by a measurable amount.

18. The method of claim 11 wherein said depositing a thin film over the surface of said recessed dual damascene structure thereby including the surface surrounding said dual damascene structure is depositing a film that contains $Si_3N_4$ or any other suitable material that can provide protection of a copper surface against oxidation or chemical or mechanical damage.

19. The method of claim 11 wherein said removing part of said deposited thin film is a Chemical Mechanical Polishing process thereby leaving said thin film in place above the copper surface thereby providing a layer of protection against dishing and erosion for said copper surface of said dual damascene structure thereby furthermore removing completely said thin film and said barrier metal from the surface of said second layer of dielectric.

20. The method of claim 11 wherein said removing part of said deposited thin film is a plasma etch process whereby Cl or F plasma can be used as an etchant thereby providing high selectivity of etching a Ta-based material relative to $Si_3N_4$ or similar type material.

* * * * *